(12) United States Patent
Kido et al.

(10) Patent No.: US 10,519,067 B2
(45) Date of Patent: Dec. 31, 2019

(54) CEMENTED CARBIDE AND CUTTING TOOL

(71) Applicant: Sumitomo Electric Industries, Ltd., Osaka-shi (JP)

(72) Inventors: Yasuki Kido, Itami (JP); Michiko Matsukawa, Itami (JP); Keiichi Tsuda, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 94 days.

(21) Appl. No.: 15/747,494

(22) PCT Filed: Apr. 13, 2017

(86) PCT No.: PCT/JP2017/015138
§ 371 (c)(1),
(2) Date: Jan. 25, 2018

(87) PCT Pub. No.: WO2017/191744
PCT Pub. Date: Nov. 9, 2017

(65) Prior Publication Data
US 2018/0222804 A1 Aug. 9, 2018

(30) Foreign Application Priority Data

May 2, 2016 (JP) ................................. 2016-092813

(51) Int. Cl.
*C04B 35/56* (2006.01)
*C22C 29/08* (2006.01)
(Continued)

(52) U.S. Cl.
CPC ........ *C04B 35/5626* (2013.01); *B23B 27/148* (2013.01); *C22C 29/08* (2013.01);
(Continued)

(58) Field of Classification Search
CPC ................................................ B22F 2005/001
See application file for complete search history.

(56) References Cited

U.S. PATENT DOCUMENTS

| | | | | |
|---|---|---|---|---|
| 5,580,666 A | * | 12/1996 | Dubensky | ............... C22C 29/08 428/546 |
| 6,210,632 B1 | * | 4/2001 | Ostlund | .................. C22C 1/051 419/15 |
| 2005/0126336 A1 | * | 6/2005 | Jansson | ................... C22C 29/08 75/240 |

FOREIGN PATENT DOCUMENTS

| | | |
|---|---|---|
| DE | 102011053740 A1 | 3/2013 |
| EP | 0665308 A1 | 8/1995 |
| JP | 2016-020541 A | 2/2016 |

* cited by examiner

*Primary Examiner* — Vanessa T. Luk
(74) *Attorney, Agent, or Firm* — Baker Botts L.L.P.; Michael A. Sartori (57) ABSTRACT

A cemented carbide including a hard phase, a binding phase, and inevitable impurities. The hard phase satisfies a first hard phase composed mainly of tungsten carbide, and a second hard phase composed mainly of a compound. The compound contains multiple types of metallic elements including tungsten and at least one element selected from carbon, nitrogen, oxygen, and boron. The second hard phase satisfies D10/D90<0.4, wherein D10 denotes a cumulative 10% grain size in an area-based grain size distribution on a surface or cross section of the cemented carbide, and D90 denotes a cumulative 90% grain size in the area-based grain size distribution, and satisfies $\sigma^2<5.0$, wherein $\sigma^2$ denotes the variance of the distance between the centroids of the nearest two of the second hard phases. The average grain size $D_W$ of the first hard phase ranges from 0.8 to 4.0 μm and satisfies $D_M/D_W<1.0$, wherein $D_M$ denotes the average grain size of the second hard phase.

5 Claims, 1 Drawing Sheet

(51) Int. Cl.
   *B23B 27/14*   (2006.01)
   *C23C 14/06*   (2006.01)
   *C23C 14/48*   (2006.01)
   *B22F 5/00*    (2006.01)

(52) U.S. Cl.
   CPC .......... *C23C 14/0641* (2013.01); *C23C 14/48* (2013.01); *B22F 2005/001* (2013.01); *B23B 2222/28* (2013.01); *C04B 2235/3817* (2013.01); *C04B 2235/3839* (2013.01); *C04B 2235/3843* (2013.01); *C04B 2235/3886* (2013.01); *C04B 2235/405* (2013.01)

CEMENTED CARBIDE AND CUTTING TOOL

TECHNICAL FIELD

The present invention relates to a cemented carbide and a cutting tool.

The present application claims the priority of Japanese Patent Application No. 2016-092813, filed May 2, 2016, which is incorporated herein by reference in its entirety.

BACKGROUND ART

Cemented carbides including a hard phase composed mainly of tungsten carbide (WC) and a binding phase composed mainly of an iron group element are used as materials for cutting tools. The characteristics required for cutting tools include strength (for example, transverse rupture strength), toughness (for example, fracture toughness), hardness (for example, Vickers hardness), plastic deformation resistance, and wear resistance.

For example, in a cemented carbide described in Patent Literature 1, WC grains are tightly bound to improve plastic deformation resistance. A cemented carbide described in Patent Literature 1 includes a hard phase formed of at least one composite compound of carbide, nitride, and carbonitride containing tungsten (W) and an metallic element other than W, in addition to a hard phase composed mainly of WC. WC grains and composite compound grains are bound together to improve fracture resistance.

CITATION LIST

Patent Literature

PTL 1: Japanese Unexamined Patent Application Publication No. 2016-20541

SUMMARY OF INVENTION

A cemented carbide according to the present disclosure is a cemented carbide including a hard phase, a binding phase, and inevitable impurities,
  wherein the hard phase includes
  a first hard phase composed mainly of tungsten carbide, and
  a second hard phase composed mainly of a compound, the compound containing multiple types of metallic elements including tungsten and at least one element selected from carbon, nitrogen, oxygen, and boron,
  the second hard phase satisfies
  D10/D90<0.4, wherein D10 denotes a cumulative 10% grain size in an area-based grain size distribution on a surface or cross section of the cemented carbide, and D90 denotes a cumulative 90% grain size in the area-based grain size distribution, and
  $\sigma^2 < 5.0$, wherein $\sigma^2$ denotes the variance of the distance between the centroids of the nearest two of the second hard phases, and
  the average grain size $D_W$ of the first hard phase ranges from 0.8 to 4.0 μm and satisfies $D_M/D_W < 1.0$, wherein $D_M$ denotes the average grain size of the second hard phase.

A cutting tool according to the present disclosure includes a cemented carbide according to the present disclosure as a substrate.

DESCRIPTION OF EMBODIMENTS

Problems to be Solved by the Present Disclosure

With increasing difficulty of cutting and more complicated processing shapes of workpieces in cutting, the requirements for cutting tools are becoming more stringent. Thus, there is a demand for cemented carbides with higher fracture resistance.

Accordingly, it is an object of the present invention to provide a cemented carbide with high fracture resistance. It is another object of the present invention to provide a cutting tool with high fracture resistance.

Advantages of the Invention

The present disclosure can provide a cemented carbide and a cutting tool with high fracture resistance.

Description of Embodiments of Present Invention

First, the embodiments of the present invention will be described below.

(1) A cemented carbide according to an embodiment of the present invention is a cemented carbide including a hard phase, a binding phase, and inevitable impurities,
  wherein the hard phase includes
  a first hard phase composed mainly of tungsten carbide, and
  a second hard phase composed mainly of a compound, the compound containing multiple types of metallic elements including tungsten and at least one element selected from carbon, nitrogen, oxygen, and boron,
  the second hard phase satisfies
  D10/D90<0.4, wherein D10 denotes a cumulative 10% grain size in an area-based grain size distribution on a surface or cross section of the cemented carbide, and D90 denotes a cumulative 90% grain size in the area-based grain size distribution, and
  $\sigma^2 < 5.0$, wherein $\sigma^2$ denotes the variance of the distance between the centroids of the nearest two of the second hard phases, and
  the average grain size $D_W$ of the first hard phase ranges from 0.8 to 4.0 μm and satisfies $D_M/D_W < 1.0$, wherein $D_M$ denotes the average grain size of the second hard phase.

Having the second hard phase with a uniform grain size uniformly dispersed in the structure, the cemented carbide has high toughness and fracture resistance. Uniform dispersion of the second hard phase increases the number of contacts between first hard phase grains (WC grains) and second hard phase grains. Elements can more easily interdiffuse at an interface between a first hard phase grain and a second hard phase grain than at an interface between first hard phase grains. Thus, strong binding can be formed at an interface between a first hard phase grain and a second hard phase grain. Thus, a high-strength interface can be formed between a first hard phase grain and a second hard phase grain. The second hard phase with a grain size satisfying D10/D90<0.4 has a substantially uniform grain size in the structure. Thus, binding strength at an interface between a first hard phase grain and a second hard phase grain can be made uniform. Having dispersity satisfying $\sigma^2<5.0$, the second hard phase can be uniformly dispersed in the structure and can uniformly improve strength throughout the structure. The cemented carbide has many high-strength interfaces between first hard phase grains and second hard phase grains and therefore has high toughness and fracture resistance.

When the first hard phase has an average grain size $D_W$ of 0.8 μm or more, the cemented carbide can have high toughness. When the first hard phase has an average grain size $D_W$ of 4.0 μm or less, the cemented carbide can have high hardness.

When the second hard phase has an average grain size $D_M$ satisfying $D_M/D_W<1.0$, that is, when the second hard phase has an average grain size $D_M$ smaller than the average grain size $D_W$ of the first hard phase, it is easy to improve binding strength at an interface between a first hard phase grain and a second hard phase grain and to provide a cemented carbide with high fracture resistance. Furthermore, the characteristics (reaction resistance, etc.) of the second hard phase can be effectively exhibited.

(2) In one embodiment of the cemented carbide, the second hard phase is a compound phase or a solid solution phase consisting of at least one compound. The at least one compound contains tungsten, at least one metallic element other than tungsten selected from the elements of groups 4, 5, and 6 of the periodic table, and at least one element selected from carbon, nitrogen, oxygen, and boron.

Being the compound phase or solid solution phase, the second hard phase can increase the binding strength of the cemented carbide structure, can easily improve the strength of the cemented carbide, and can improve the wear resistance of the cemented carbide.

(3) A cutting tool according to an embodiment of the present invention includes the cemented carbide described in (1) or (2) as a substrate.

The cutting tool including the cemented carbide with high fracture resistance as a substrate can perform processing under severer cutting conditions and can have an extended life.

(4) In one embodiment of the cutting tool, at least part of the surface of the substrate is covered with a hard film.

The hard film on the surface of the substrate can improve the wear resistance of the cutting tool. Thus, the cutting tool can withstand severer cutting conditions and can have an extended life.

Details of Embodiments of Present Invention

Embodiments of the present invention will be described in detail below. The present invention is defined by the appended claims rather than by these embodiments. All modifications that fall within the scope of the claims and the equivalents thereof are intended to be embraced by the claims.

[Cemented Carbide]

A cemented carbide according to an embodiment is composed of a hard phase, a binding phase for binding the hard phase, and inevitable impurities. The inevitable impurities include oxygen and metallic elements of the order of ppm contained in raw materials or introduced from production processes.

<Hard Phase>

The hard phase includes a first hard phase composed mainly of tungsten carbide (WC), and a second hard phase composed mainly of a compound containing multiple types of metallic elements including tungsten (W) and at least one element selected from carbon (C), nitrogen (N), oxygen (O), and boron (B). The cemented carbide according to the present embodiment includes the second hard phase with a uniform grain size uniformly dispersed in the structure. Uniform dispersion of the second hard phase with a uniform grain size in the structure increases the number of contacts between first hard phase grains and second hard phase grains. More elements can diffuse, and consequently elements can more easily interdiffuse, at an interface between a first hard phase grain and a second hard phase grain than at an interface between first hard phase grains. Thus, strong binding can be formed at an interface between a first hard phase grain and a second hard phase grain. Thus, the interface between a first hard phase grain and a second hard phase grain has high strength.

Such high-strength interfaces uniformly dispersed in the structure can provide the cemented carbide with high fracture resistance.

The composition of the hard phase can be easily determined by observation of a cross section of the cemented carbide with an optical microscope, or by image analysis of a cross section of the cemented carbide with a scanning electron microscope (SEM) and by energy dispersive spectroscopy (EDS) (EDS area analysis).

The hard phase in the cemented carbide may constitute 80% or more by mass or 90% or more by mass of the cemented carbide. The hard phase in the cemented carbide may constitute 96% or less by mass or 95% or less by mass of the cemented carbide. [0027]

(First Hard Phase)

The first hard phase is composed mainly of WC. The phrase "composed mainly of" means that WC constitutes 50% or more by mass of the first hard phase. For example, WC may constitute 70% or more by mass or 80% or more by mass of the first hard phase. In particular, the first hard phase may be composed substantially of WC alone.

The first hard phase may constitute 50% or more by mass, for example, 70% to 98% by mass, of the hard phase. When the first hard phase constitutes 70% or more by mass of the hard phase, the cemented carbide can have high toughness and fracture resistance. When the first hard phase constitutes 98% or less by mass of the hard phase, the cemented carbide can have high fracture resistance due to the relatively increased second hard phase content, as described later. Furthermore, the first hard phase may constitute 80% to 97.5% by mass, particularly 90% to 97% by mass, of the hard phase.

The first hard phase has an average grain size $D_W$ in the range of 0.8 to 4.0 μm. The first hard phase with an average grain size $D_W$ of 0.8 μm or more can increase toughness and reduce chipping and fracture caused by mechanical or thermal shock. This can also improve crack propagation resistance, reduce crack propagation, and reduce chipping and fracture. The first hard phase with an average grain size $D_W$ of 4.0 μm or less can increase hardness, reduce deformation during cutting, and reduce wear and fracture. The first hard phase preferably has an average grain size $D_W$ in the range of 1.0 to 3.5 μm, particularly preferably 2.0 μm or more and 2.5 μm or less.

The "average grain size" can be determined by mirror-finishing a surface or cross section of cemented carbide, taking an image of the machined surface with a microscope, and performing an image analysis of the image. The grain sizes (Heywood diameters: circle-equivalent diameters) of first hard phase grains (WC grains) are determined from the image and are averaged to calculate the average grain size of the first hard phase. The number of first hard phase grains to be measured is preferably 100 or more, more preferably 200 or more. The image analysis is preferably performed in multiple fields of the same cemented carbide to calculate the average as the average grain size of the first hard phase. The number of fields is preferably 5 or more, more preferably 7 or more. The average grain size of the second hard phase described later is determined in the same way.

The mirror finishing may be performed by polishing with a diamond paste, by using a focused ion beam (FIB) system, by using a cross-section polisher (CP), or by a combination thereof. For photographing of the machined surface with a metallographic microscope, the machined surface is preferably etched with a Murakami's reagent. The microscope may be a metallographic microscope or a scanning electron microscope (SEM). An image taken with a microscope is captured on a computer and is analyzed by image analysis software to acquire information such as the average grain size. Image analysis and grain size distribution measurement software ("Mac-View" available from Mountech Co., Ltd.) is suitable for such software.

(Second Hard Phase)

The second hard phase is composed mainly of a compound containing "multiple types of metallic elements including W" and "at least one element selected from C, N, O, and B". More specifically, the second hard phase is composed mainly of a compound (composite compound) containing "W", "at least one metallic element other than W selected from the elements of groups 4, 5, and 6 of the periodic table", and "at least one element selected from C, N, O, and B". The elements of groups 4, 5, and 6 of the periodic table include titanium (Ti), vanadium (V), chromium (Cr), zirconium (Zr), niobium (Nb), and tantalum (Ta). The compound is mainly a carbide, nitride, carbonitride, oxide, or boride of multiple types of metallic elements including W.

The phrase "composed mainly of" means that the compound constitutes 50% or more by mass of the second hard phase. For example, the compound may constitute 70% or more by mass or 80% or more by mass of the second hard phase. In particular, the second hard phase may be composed substantially of the compound alone.

The second hard phase is a compound phase or a solid solution phase composed of at least one of the compounds. The phrase "compound phase or solid solution phase" means that a compound constituting such a phase may form a solid solution or may be present as an individual compound without forming a solid solution.

More specifically, the second hard phase may be (W, Ti)C, (W, Ti)N, (W, Ti)(C, N), (W, Ti, Nb)C, (W, Ti, Nb)N, (W, Ti, Nb)(C, N), (W, Cr)C, (W, Cr)N, (W, Cr)(C, N), (W, Ti, Ta)C, (W, Ti, Ta)N, (W, Ti, Ta)(C, N), (W, Nb, Ta)C, (W, Nb, Ta)N, (W, Nb, Ta)(C, N), (W, Zr)C, (W, Zr)N, or (W, Zr)(C, N).

The second hard phase may constitute 2% to 30% by mass of the hard phase. When the second hard phase constitutes 2% or more by mass of the hard phase, first hard phase grains and second hard phase grains can be tightly bound together, and the cemented carbide can have high fracture resistance. When the second hard phase constitutes 30% or less by mass of the hard phase, the cemented carbide can have high toughness and fracture resistance due to the relatively increased first hard phase content. Furthermore, the second hard phase may constitute 2.5% to 15% by mass, particularly 3% to 10% by mass, of the hard phase.

The second hard phase satisfies D10/D90<0.4, wherein D10 denotes a cumulative 10% grain size in an area-based grain size distribution on a surface or cross section of the cemented carbide, and D90 denotes a cumulative 90% grain size in the area-based grain size distribution. In other words, the second hard phase has a substantially uniform grain size. When the second hard phase has a uniform grain size, this can make binding strength uniform at interfaces between first hard phase grains and second hard phase grains. The second hard phase preferably satisfies D10/D90<0.35, particularly preferably D10/D90<0.33.

The "D10/D90" can be determined in the same manner as the average grain size by mirror-finishing a surface or cross section of cemented carbide, taking an image of the machined surface with a microscope, and performing an image analysis of the image.

The second hard phase satisfies $\sigma^2$<5.0, wherein $\sigma^2$ denotes the variance of the distance between the centroids of nearest two of the second hard phases. In other words, the second hard phase is uniformly dispersed throughout the cemented carbide. When the second hard phase is uniformly dispersed, a high-strength interface between a first hard phase grain and a second hard phase grain is present throughout the cemented carbide and can thereby improve the fracture resistance of the cemented carbide. The second hard phase preferably satisfies $\sigma^2$<3.0, particularly preferably $\sigma^2$<2.0.

The average grain size $D_M$ of the second hard phase is smaller than the average grain size $D_W$ of the first hard phase, that is, $D_M/D_W$<1.0. Satisfying $D_M/D_W$<1.0 can improve binding strength at an interface between a first hard phase grain and a second hard phase grain. The average grain size $D_M$ of the second hard phase preferably satisfies $D_M/D_W$<0.6, particularly preferably $D_M/D_W$<0.5. When the second hard phase grains have an excessively small average grain size $D_M$, however, it is difficult to bind the first hard phase grains and the second hard phase grains together. Thus, the second hard phase preferably satisfies $D_M/D_W$>0.1, more preferably $D_M/D_W$>0.2.

<Binding Phase>

The binding phase is composed mainly of an iron group element and binds the hard phase. The phrase "composed mainly of" means that the iron group element constitutes 50% or more by mass of the binding phase. Typically, the iron group element constituting the binding phase may be nickel (Ni), cobalt (Co), or iron (Fe). These may be used alone or in combination. The binding phase may contain tungsten and carbon, which are components of the hard phase, and other inevitable components.

The binding phase may contain at least one of chromium (Cr) and vanadium (V). These elements can be derived from a grain growth inhibitor used as required in a production process of cemented carbide. These elements, if present at all, in the binding phase are probably present in the form of solid solution in the binding phase.

The binding phase preferably constitutes 4% to 20% by mass of the cemented carbide. When the binding phase constitutes 4% or more by mass of the cemented carbide, the binding phase reduces degradation in sinterability during production and tightly binds the hard phase, thereby increasing strength and reducing fracture. When the binding phase constitutes 4% or more by mass of the cemented carbide, the cemented carbide has improved toughness. When the binding phase constitutes 20% or less by mass of the cemented carbide, this can reduce the decrease in the hardness of the cemented carbide resulting from the relatively decreased hard phase and can reduce the decrease in wear resistance and plastic deformation resistance. The binding phase more preferably constitutes 5% to 15% by mass, particularly preferably 8% to 10% by mass, of the cemented carbide.

[Method for Producing Cemented Carbide]

Typically, the cemented carbide according to the present embodiment can be produced through a raw powder preparation step=>a mixing step=>a forming step=>a sintering step=>and a cooling step.

<Preparation Step>

In the preparation step, all the raw material powders of the cemented carbide are prepared. The raw powders include a WC powder for the first hard phase, a compound constituent powder for the second hard phase, and an iron group metal powder for the binding phase as essential powders, and optionally include a grain growth inhibitor.

Preferably, the WC powder is spherical and has a uniform grain size. In order to uniformly disperse the second hard phase with a uniform grain size in the cemented carbide, the WC powder may be subjected to high-temperature carbonization. In the high-temperature carbonization, typically, tungsten is carbonized at a temperature in the range of 1900° C. to 2150° C. for 2 to 8 hours. After the high-temperature carbonization, the WC powder is preferably cooled from the carbonization temperature (1900° C. to 2150° C.) to a temperature in the range of 1200° C. to 1500° C. at a rate in the range of 2° C./min to 8° C./min. Thus, a spherical WC powder with a uniform grain size is produced. The spherical WC powder with a uniform grain size can be used to form a finely dispersed second hard phase and binding phase in the sintering step described later. The WC powder may have an average grain size of more than 0.8 µm and less than 4.9 µm. The average grain size of each powder refers to the average grain size by the Fisher sub-sieve sizer (FSSS) method (FSSS size). In general, a smaller average grain size of the WC powder used as a raw material results in a smaller average grain size of the first hard phase in the cemented carbide, and a larger average grain size of the WC powder used as a raw material results in a larger average grain size of the first hard phase in the cemented carbide. The WC powder used as a raw material may have an average grain size in the range of 1.0 to 4.5 µm, particularly 2.0 to 3.5 µm.

There are two types of compound constituent powders. A compound constituent powder of a first type includes compound powders each containing a constituent element of the compound constituting the second hard phase or each constituent element powder. In this case, a constituent element of each powder dissolves temporarily in the binding phase and forms a composite in the sintering step described later, and is then cooled and precipitated as a composite compound. For example, when a WC powder and a TiC powder are used as raw powders, WC and TiC dissolve and form a composite in the sintering step, and are precipitated as (W, Ti)C. This (W, Ti)C forms the second hard phase (composite compound phase).

In a compound constituent powder of a second type, a compound powder containing W and a metallic element other than W (a composite compound powder) is used as a raw powder. In this case, the raw powder maintains its form in the sintering step described later. For example, when a (W, Ti)C powder is used as a raw powder, and the (W, Ti)C powder is excessive, the (W, Ti)C powder may maintain its form after sintering. This (W, Ti)C forms the second hard phase (composite compound phase).

In order to uniformly disperse the second hard phase with a uniform grain size in the cemented carbide, a fine compound constituent powder with a uniform grain size may be used. This enables the second hard phase to be finely dispersed in the sintering step described later. The compound constituent powder may have an average grain size of 0.1 µm or more and less than 1.5 µm. A smaller average grain size of the compound constituent powder used as a raw material results in a smaller average grain size of the second hard phase in the cemented carbide, and a larger average grain size of the compound constituent powder used as a raw material results in a larger average grain size of the second hard phase in the cemented carbide. The compound constituent powder used as a raw material may have an average grain size in the range of 0.2 to 1.4 µm, particularly 0.3 to 1.3 µm. A fine compound constituent powder with a uniform grain size can be produced by grinding and classifying a commercial product.

The iron group metal powder may have an average grain size in the range of 0.2 to 3.0 µm or 0.3 to 1.6 µm.

<Mixing Step>

The raw powders prepared in the preparation step are mixed in the mixing step. A mixed powder of the raw powders is produced in the mixing step. A known apparatus can be used in the mixing step. For example, an attritor, a tumbling ball mill, and a bead mill can be used. In order to uniformly disperse the second hard phase with a uniform grain size in the cemented carbide, the raw powders are mixed under the conditions where the WC powder and the compound constituent powder are not excessively ground. The conditions for mixing in an attritor include the number of revolutions in the range of 30 to 500 rpm and the mixing time of 30 minutes or more and less than 300 minutes. The number of revolutions is preferably low and may be 400 rpm or less or 300 rpm or less. The mixing time is preferably short and may be 120 minutes or less, particularly 100 minutes or less. Preferably, a grinding medium is not used for mixing in an attritor.

The mixing may be wet mixing or dry mixing. The mixing may be performed in a solvent, such as water, ethanol, acetone, or isopropyl alcohol.

After the mixing step, the mixed powder may be granulated, if necessary. A granulated mixed powder can be easily charged in a die or mold in the forming step described later. The granulation may be performed by a known granulation method, for example, with a commercially available granulator, such as a spray dryer.

<Forming Step>

The mixed powder produced in the mixing step is formed into a compact in a predetermined shape in the forming step. The forming method and forming conditions in the forming step may be any common method and conditions. The predetermined shape may be a cutting tool shape.

<Sintering Step>

The compact produced in the forming step is sintered to form a sintered body in the sintering step. In order to uniformly disperse the second hard phase with a uniform grain size in the cemented carbide, sintering may be performed above the temperature at which a liquid phase of the binding phase is formed and below the temperature at which the second hard phase is not grown. More specifically, the sintering temperature may range from 1300° C. to 1350° C. A sintering temperature of more than 1350° C. results in grain growth in the second hard phase and variations in the grain size of the second hard phase. Thus, the sintering temperature is preferably low in the temperature range in which a liquid phase of the binding phase is formed, and is preferably 1340° C. or less, particularly preferably 1330° C. or less. An excessively long sintering time tends to result in grain growth in the second hard phase and variations in the grain size of the second hard phase. Thus, the sintering time preferably ranges from 0.5 to 2.5 hours, more preferably 1.0 to 2.0 hours.

The sintering atmosphere may be, but is not limited to, a $N_2$ gas atmosphere or an atmosphere of an inert gas, such as Ar. The degree of vacuum (pressure) during sintering may be 10 kPa or less, 5 kPa or less, particularly 3 kPa or less.

The sintering step may include sintering HIP (sinter HIP), in which a compact can be pressed during sintering. The HIP conditions may include a temperature in the range of 1300° C. to 1350° C. and a pressure in the range of 5 to 200 MPa in a $N_2$ gas atmosphere or in an atmosphere of an inert gas, such as Ar.

<Cooling Step>

After sintering, the sintered body is cooled in the cooling step. In order to uniformly disperse the second hard phase with a uniform grain size in the cemented carbide, the sintered body in the cooling step may be rapidly cooled from the sintering temperature to the liquid phase solidification temperature and held at the temperature for a predetermined period. More specifically, the sintered body is rapidly cooled from the sintering temperature (1300° C. to 1350° C.) to a temperature in the range of 1200° C. to 1250° C. at a cooling rate of 20° C./min or more or 25° C./min or more. Rapid cooling from the sintering temperature can prevent aggregation of the second hard phase. After rapid cooling to the liquid phase solidification temperature, the temperature is held for approximately 10 to 60 minutes. Variations (increases in variance $\sigma^2$) of the second hard phase in the cemented carbide can be reduced during the holding time.

The cooling atmosphere may be, but is not limited to, a $N_2$ gas atmosphere or an atmosphere of an inert gas, such as Ar. The degree of vacuum (pressure) during cooling may be 100 kPa or less, 10 kPa or more, and 50 kPa or less.

[Cutting Tool]

<Substrate>

Cutting tools according to embodiments include cemented carbide as a substrate. A cutting tool according to the present embodiment include the cemented carbide as a substrate. Thus, the cutting tool can have high fracture resistance.

The cutting tool may have any shape. The cutting tool may be a bit, a ball mill, an end mill, a drill, or a reamer. In particular, the bit may be an indexable insert.

<Hard Film>

The cutting tool may include a hard film on the substrate. The composition of the hard film may be a carbide, nitride, oxide, or boride of at least one element selected from the metallic elements of groups 4, 5, and 6 of the periodic table, aluminum (Al), and silicon (Si), or a solid solution thereof, for example, Ti(C, N), $Al_2O_3$, (Ti, Al)N, TiN, TiC, or (Al, Cr)N. Cubic boron nitride (cBN) and diamond-like carbon are also suitable for the composition of the hard film. The hard film can be formed by a gas phase method, such as a chemical vapor deposition (CVD) method or a physical vapor deposition (PVD) method. The hard film formed by the CVD method tends to have high adhesion to the substrate. The CVD method may be a thermal CVD method. The hard film formed by the PVD method tends to have high toughness due to compressive residual stress.

The hard film preferably covers a portion of the substrate that is to become a cutting edge and a vicinity of the portion, or may cover the entire surface of the substrate. The hard film may be monolayer or multilayer. The hard film may have a thickness in the range of 1 to 20 μm or 1.5 to 15 μm.

TEST EXAMPLE

Test Example 1

In Test Example 1, a cutting tool (indexable insert) including a substrate formed of cemented carbide was produced and tested.

<Preparation of Sample>

Powders with the composition and average grain size listed in Table 1 were prepared as raw powders (preparation step). The WC powder was subjected to high-temperature carbonization (2000° C.×5 hours). The average grain size of each raw powder is the average grain size determined by the FSSS method. The powders and a solvent were mixed in a commercially available attritor to produce a mixed powder (mixing step). The mixing conditions included the mixing time of 1 hour and the number of revolutions of 250 rpm. After mixing, the mixed powder was dried by spray-drying to produce a granulated powder.

The granulated powder was pressed to form a compact in the shape of a model number SEET13T3AGSN-G (manufactured by Sumitomo Electric Hardmetal Corp.) (forming step).

The compact was sintered in an Ar gas atmosphere in a sintering furnace at 1330° C. for 2 hours (sintering step).

After sintering, the compact was rapidly cooled to 1250° C. at a cooling rate of 20° C./min in an Ar gas atmosphere and was held at 1250° C. for 30 minutes. The compact was then cooled to room temperature at a cooling rate of 50° C./min (cooling step).

The cemented carbide thus produced was subjected to cutting edge treatment, such as honing, as appropriate to produce cemented carbide substrates (shape: SEET13T3AGSN-G) of an indexable insert of sample Nos. 1-1 to 1-5 and 1-11 to 1-15 listed in Table 1.

TABLE 1

| | Composition of raw powder | | | | | | | | | | | | | | | |
|---|---|---|---|---|---|---|---|---|---|---|---|---|---|---|---|---|
| | WC | | TiC | | NbC | | ZrC | | TiN | | TaC | | $Cr_3C_2$ | | Co | |
| Sample No. | Mass % | Average grain size (μm) | Mass % | Average grain size (μm) | Mass % | Average grain size (μm) | Mass % | Average grain size (μm) | Mass % | Average grain size (μm) | Mass % | Average grain size (μm) | Mass % | Average grain size (μm) | Mass % | Average grain size (μm) |
| 1-1 | Remainder | 2.6 | 0.5 | 0.7 | — | — | — | — | — | — | 2.0 | 0.6 | 0.3 | 0.9 | 10 | 0.4 |
| 1-2 | Remainder | 2.6 | — | — | 0.6 | 0.9 | — | — | — | — | 2.0 | 0.6 | 0.3 | 0.9 | 10 | 0.4 |
| 1-3 | Remainder | 2.6 | — | — | — | — | 0.5 | 1.2 | — | — | 2.0 | 0.6 | 0.3 | 0.9 | 10 | 0.4 |
| 1-4 | Remainder | 2.6 | 0.5 | 0.7 | 0.6 | 0.9 | — | — | — | — | 2.0 | 0.6 | 0.3 | 0.9 | 10 | 0.4 |
| 1-5 | Remainder | 2.6 | 0.5 | 0.7 | — | — | — | — | 0.5 | 1.3 | 2.0 | 0.6 | 0.3 | 0.9 | 10 | 0.4 |
| 1-11 | Remainder | 2.6 | 0.5 | 0.7 | — | — | — | — | — | — | 2.0 | 1.5 | 0.3 | 0.9 | 10 | 0.4 |

TABLE 1-continued

| | Composition of raw powder | | | | | | | | | | | | | | | |
|---|---|---|---|---|---|---|---|---|---|---|---|---|---|---|---|---|
| | WC | | TiC | | NbC | | ZrC | | TiN | | TaC | | $Cr_3C_2$ | | Co | |
| Sample No. | Mass % | Average grain size (μm) | Mass % | Average grain size (μm) | Mass % | Average grain size (μm) | Mass % | Average grain size (μm) | Mass % | Average grain size (μm) | Mass % | Average grain size (μm) | Mass % | Average grain size (μm) | Mass % | Average grain size (μm) |
| 1-12 | Remainder | 2.6 | 0.5 | 2.5 | — | — | — | — | — | — | 2.0 | 0.6 | 0.3 | 0.9 | 10 | 0.4 |
| 1-13 | Remainder | 2.6 | 0.5 | 0.7 | — | — | — | — | — | — | 2.0 | 0.6 | 0.3 | 2.5 | 10 | 0.4 |
| 1-14 | Remainder | 0.8 | 0.5 | 0.7 | — | — | — | — | — | — | 2.0 | 0.6 | 0.3 | 0.9 | 10 | 0.4 |
| 1-15 | Remainder | 4.9 | 0.5 | 0.7 | — | — | — | — | — | — | 2.0 | 0.6 | 0.3 | 0.9 | 10 | 0.4 |

<Observation of Structure>

A cutting edge of the cemented carbide substrates (each sample) was subjected to cutting, mirror-finishing, and then ion milling with an argon ion beam. These cross sections were used as microscopic observation samples.

Figure 1:
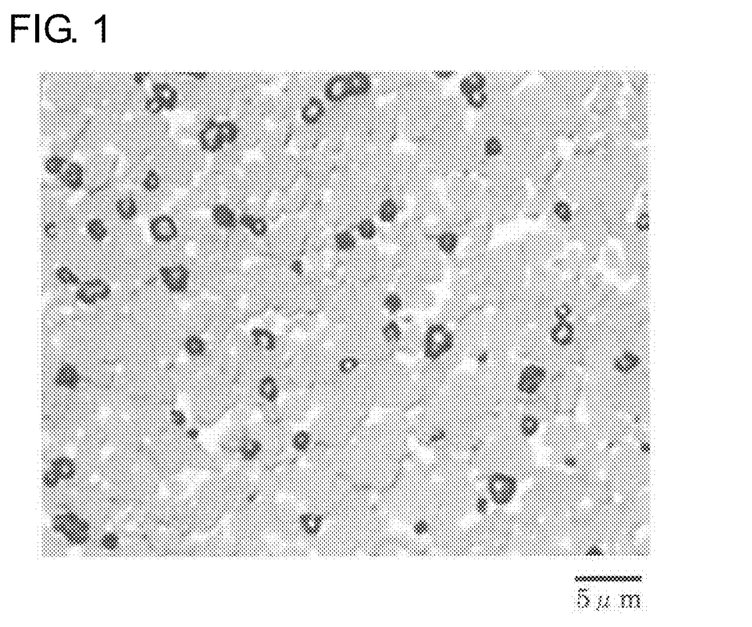
FIG. 1 is a scanning electron micrograph of a cross section of a cemented carbide of a sample No. 1-1 in a test example.
Figure 2:
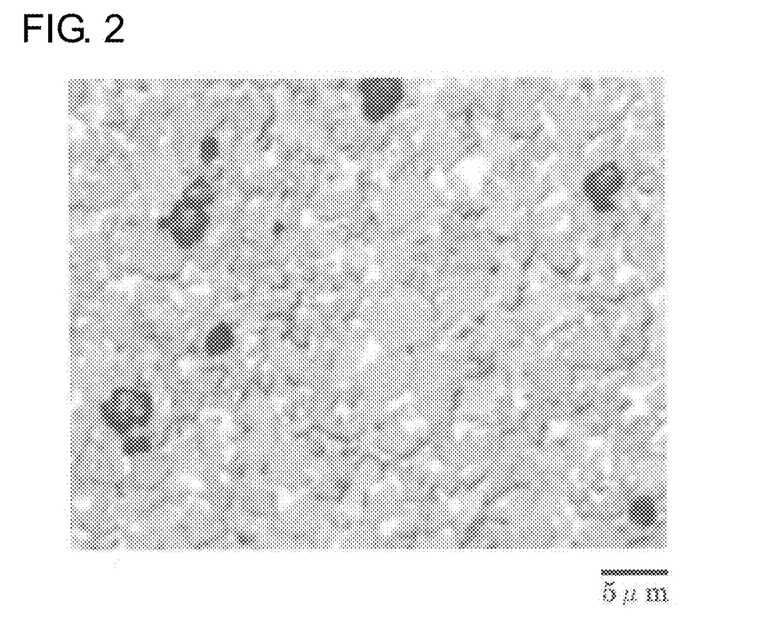
FIG. 2 is a scanning electron micrograph of a cross section of a cemented carbide of a sample No. 1-12 in a test example.

Machined surfaces of the observation samples were photographed with a SEM at a magnification of approximately 1500 to capture backscattered electron images. Images in 10 fields were taken in each sample. By way of example, a cross-sectional picture of the sample No. 1-1 is shown in FIG. 1, and a cross-sectional picture of the sample No. 1-12 is shown in FIG. 2. In the figures, gray represents first hard phase grains (WC grains), black represents second hard phase grains (composite compound grains containing W), and the white region therebetween represents the binding phase. In FIGS. 1 and 2, an EDS area analysis showed that the second hard phase grains were formed of a (W, Ti, Ta)C composite compound. FIG. 1 shows that second hard phase grains are uniformly dispersed between first hard phase grains. FIG. 2 shows that second hard phase grains are unevenly dispersed between first hard phase grains.

In each sample, the grain sizes (Heywood diameters) of 300 or more first hard phase grains and 300 or more second hard phase grains were determined in 1 field by the image analysis and grain size distribution measurement software ("Mac-View" available from Mountech Co., Ltd.). The average grain size of each of the first hard phase and the second hard phase was calculated in 10 fields. Table 2 shows the results. The ratio D10/D90 of the cumulative 10% grain size D10 to the cumulative 90% grain size D90 of the second hard phase grains in the grain size distribution in 1 field was determined by the image analysis and grain size distribution measurement software ("Mac-View" available from Mountech Co., Ltd.). The average value of D10/D90 was calculated in 10 fields. Table 2 shows the results. The variance $\sigma^2$ of the distance between the centroids of the nearest two second hard phase grains in 1 field was determined by the image analysis and grain size distribution measurement software ("Mac-View" available from Mountech Co., Ltd.). The average variance $\sigma^2$ was calculated in 10 fields. Table 2 shows the results. The conditions for detection by "Mac-View" include grain shape: non-spherical, detectivity: low-cut, and scan density: 7.

TABLE 2

| Sample No. | Grain size D10/D90 of second hard phase | Variance $\sigma^2$ of second hard phase | Average grain size of first hard phase $D_W$ (μm) | Average grain size of second hard phase $D_M$ (μm) | $D_M/D_W$ | Cut length to fracture (average) (mm) |
|---|---|---|---|---|---|---|
| 1-1 | 0.33 | 1.6 | 2.3 | 0.8 | 0.348 | 2880 |
| 1-2 | 0.36 | 2.4 | 2.3 | 0.9 | 0.391 | 2620 |
| 1-3 | 0.38 | 3.1 | 2.4 | 1.1 | 0.458 | 2480 |
| 1-4 | 0.32 | 1.3 | 2.2 | 1.1 | 0.500 | 2900 |
| 1-5 | 0.31 | 1.1 | 2.2 | 1.1 | 0.500 | 2920 |
| 1-11 | 0.39 | 4.8 | 2.2 | 2.3 | 1.045 | 1980 |
| 1-12 | 0.52 | 7.1 | 2.2 | 2.4 | 1.091 | 1740 |
| 1-13 | 0.51 | 6.3 | 2.2 | 0.8 | 0.364 | 1820 |
| 1-14 | 0.31 | 1.1 | 0.6 | 0.5 | 0.833 | 1680 |
| 1-15 | 0.38 | 3.2 | 4.2 | 2.2 | 0.524 | 1920 |

In the sample Nos. 1-1 to 1-5, produced from the fine WC powder with a uniform grain size to form the first hard phase and the fine compound constituent powder with a uniform grain size to form the second hard phase, the grain size of the second hard phase satisfied D10/D90 of less than 0.4, and the second hard phase satisfied the variance $\sigma^2$ of less than 5.0. Thus, in the sample Nos. 1-1 to 1-5, the second hard phase with a uniform grain size was uniformly dispersed in the cemented carbide (see also FIG. 1). Uniform dispersion of the second hard phase with a uniform grain size increases the number of contacts between first hard phase grains and second hard phase grains and promotes the diffusion of elements at an interface between a first hard phase grain and a second hard phase grain, thereby forming strong binding at the interface. In the sample Nos. 1-1 to 1-5, the first hard phase had an average grain size $D_W$ in the range of 0.8 to 4.0 μm, and the ratio ($D_M/D_W$) of the average grain size $D_M$ of the second hard phase to $D_W$ was less than 1.0. The second hard phase smaller than the first hard phase can form strong binding at an interface between a first hard phase grain and a second hard phase grain.

In the sample No. 1-11, the grain size of the second hard phase satisfied D10/D90 of less than 0.4, and the second hard phase satisfied the variance $\sigma^2$ of less than 5.0, but $D_M/D_W$ of less than 1.0 was not satisfied. This is probably because the compound constituent powder (TaC powder) to form the second hard phase contained coarse grains and formed a coarse second hard phase. In the sample Nos. 1-12 and 1-13, the grain size of the second hard phase did not satisfy D10/D90 of less than 0.4, and the second hard phase did not satisfy the variance $\sigma^2$ of less than 5.0. This is probably because the compound constituent powder (TiC powder or $Cr_3C_2$ powder) to form the second hard phase in the sample Nos. 1-12 and 1-13 contained coarse grains and formed a coarse second hard phase. In the sample Nos. 1-14 and 1-15, the grain size of the second hard phase satisfied D10/D90 of less than 0.4, and the second hard phase satisfied the variance $\sigma^2$ of less than 5.0, but the first hard phase had an excessively small or large average grain size $D_W$. This is probably because the WC powder to form the first hard phase in the sample No. 1-14 contained fine grains, and the WC powder to form the first hard phase in the sample No. 1-15 contained coarse grains. In these sample Nos. 1-11 to 1-15, the second hard phase with a uniform grain size was not uniformly dispersed, or the first hard phase and the second hard phase did not have an appropriate grain size. This made it difficult for elements to diffuse at an interface between a first hard phase grain and a second hard phase grain, and made it difficult to form strong binding at the interface. Thus, fracture resistance could not be improved.

<Cutting Test>

A hard film was formed on a surface of each sample by ion plating, a known PVD method. The hard film was a TiAlN film 4.8 μm in thickness.

A cutting test was performed in each sample (indexable insert) under the following cutting conditions.

(Cutting Conditions)

Workpiece: an S50C block with φ20 holes at intervals of 10 mm

Cutting speed Vc: 280 m/min

Feed rate f: 0.4 mm/rev

Cutting depth ap: 2.0 mm

Coolant: DRY

A workpiece was processed by 300 mm×10 passes, and the cut length to fracture (maximum value: 3000 mm) was measured four times, and the average value was rated. The results are also shown in Table 2.

In the sample Nos. 1-1 to 1-5, in which the second hard phase with a uniform grain size was uniformly dispersed in the cemented carbide, the length to fracture was 2000 mm or more, indicating high fracture resistance. This is probably because strong binding was formed at an interface between a first hard phase grain and a second hard phase grain, and high-strength binding occurred throughout the cemented carbide. In particular, in the sample Nos. 1-1, 1-4, and 1-5, in which the grain size of the second hard phase satisfied D10/D90 of 0.35 or less, 0.33 or less, particularly 0.32 or less, or the second hard phase satisfied the variance $\sigma^2$ of 2.5 or less, 2.0 or less, particularly 1.5 or less, the length to fracture was 2800 mm or more or 2900 mm or more, indicating particularly high fracture resistance.

Test Example 2

In Test Example 2, a cutting tool (indexable insert) including a substrate formed of a cemented carbide was produced under the production conditions different from the production conditions for the sample No. 1-1 according to Test Example 1, and was tested.

The sample No. 2-1 was the same as the sample No. 1-1. In the sample Nos. 2-2 and 2-11, only the mixing time in the mixing step was different from that of the sample No. 2-1. In the sample No. 2-12, only the sintering temperature in the sintering step was different from that of the sample No. 2-1. In the sample No. 2-13, only the cooling time in the cooling step was different from that of the sample No. 2-1. In the sample No. 2-14, only the holding time in the cooling step was different from that of the sample No. 2-1. The other production conditions were the same as those of the sample No. 2-1. Table 3 shows the production conditions in each sample.

TABLE 3

| Sample No. | Mixing step Mixing time (h) | Sintering step Sintering temperature (° C.) | Cooling step Cooling rate to 1250° C. (° C./min) | Holding time (min) |
|---|---|---|---|---|
| 2-1 | 1.0 | 1330 | 20 | 30 |
| 2-2 | 2.0 | 1330 | 20 | 30 |
| 2-11 | 5.0 | 1330 | 20 | 30 |
| 2-12 | 1.0 | 1380 | 20 | 30 |
| 2-13 | 1.0 | 1330 | 10 | 30 |
| 2-14 | 1.0 | 1330 | 20 | 0 |

In each sample, the average grain size of each of the first hard phase and the second hard phase, and the average D10/D90 and average variance $\sigma^2$ of the second hard phase grains were determined by the image analysis and grain size distribution measurement software ("Mac-View" available from Mountech Co., Ltd.) in the same manner as in Test Example 1. Table 4 shows the results. A hard film was formed on a surface of each sample in the same manner as in Test Example 1, and a cutting test was performed. The results are also shown in Table 4.

TABLE 4

| Sample No. | Grain size D10/D90 of second hard phase | Variance $\sigma^2$ of second hard phase | Average grain size of first hard phase $D_W$ (μm) | Average grain size of second hard phase $D_M$ (μm) | $D_M/D_W$ | Cut length to fracture (average) (mm) |
|---|---|---|---|---|---|---|
| 2-1 | 0.33 | 1.6 | 2.3 | 0.8 | 0.348 | 2880 |
| 2-2 | 0.39 | 2.1 | 2.1 | 1.3 | 0.619 | 2880 |
| 2-11 | 0.71 | 8.3 | 2.3 | 1.9 | 0.826 | 1600 |
| 2-12 | 0.64 | 7.7 | 2.5 | 2.3 | 0.920 | 1580 |
| 2-13 | 0.78 | 8.5 | 2.5 | 2.1 | 0.840 | 1620 |
| 2-14 | 0.76 | 8.4 | 2.5 | 2.3 | 0.920 | 1660 |

In the sample Nos. 2-1 and 2-2, which satisfied the mixing time: less than 5.0 hours, sintering temperature: 1350° C. or less, cooling rate to 1250° C.: 20° C./min or more, and holding time at 1250° C.: 30 minutes or more, the grain size of the second hard phase satisfied D10/D90 of less than 0.4, and the second hard phase satisfied the variance $\sigma^2$ of less than 5.0. Thus, in the sample Nos. 2-1 and 2-2, the second hard phase with a uniform grain size was uniformly dispersed in the cemented carbide. In the sample Nos. 2-1 and 2-2, in which the second hard phase with a uniform grain size was uniformly dispersed in the cemented carbide, the length to fracture was 2800 mm or more, indicating high fracture resistance. This is probably because strong binding was formed at an interface between a first hard phase grain and a second hard phase grain, and high-strength binding occurred throughout the cemented carbide.

By contrast, in the sample Nos. 2-11 to 2-14, the grain size of the second hard phase did not satisfy D10/D90 of less than 0.4, and the second hard phase did not satisfy the variance $\sigma^2$ of 5.0. In the sample No. 2-11, the grain size of the second hard phase varied due to the long mixing time of the raw powders. In the sample No. 2-12, due to the excessively high sintering temperature, grains in the second hard phase grew and varied in size. In the sample No. 2-13, due to the slow cooling rate from the sintering temperature, the second hard phase aggregated and varied in grain size. In the sample No. 2-14, there was no holding at the liquid phase solidification temperature during cooling from the sintering temperature to room temperature, and therefore the second hard phase could not be made uniform and varied.

Thus, if (1) the raw powders are mixed without excessive grinding, (2) sintering is performed below a temperature at which grains in the second hard phase are not grown (1350° C. or less), and (3) rapid cooling is performed from the sintering temperature to the liquid phase solidification temperature, and the temperature is held for a predetermined period, then the second hard phase with a uniform grain size can be uniformly dispersed in cemented carbide, and the cemented carbide can have high fracture resistance.

The invention claimed is:

1. A cemented carbide comprising: a hard phase; a binding phase; and inevitable impurities,
   wherein the hard phase includes
   a first hard phase composed mainly of tungsten carbide, and
   a second hard phase composed mainly of a compound, the compound containing multiple types of metallic elements including tungsten and at least one element selected from carbon, nitrogen, oxygen, and boron, the second hard phase satisfies
   D10/D90<0.4, wherein D10 denotes a cumulative 10% grain size in an area-based grain size distribution on a surface or cross section of the cemented carbide, and D90 denotes a cumulative 90% grain size in the area-based grain size distribution, and
   $\sigma^2$<5.0, wherein $\sigma^2$ denotes a variance of a distance between centroids of nearest two of the second hard phases,
   an average grain size $D_W$ of the first hard phase ranges from 0.8 to 4.0 μm and satisfies $D_M/D_W$<1.0, wherein $D_M$ denotes an average grain size of the second hard phase, and
   an amount of the second hard phase being 2.5% to 15% by mass of the hard phase.

2. The cemented carbide according to claim 1, wherein the second hard phase is a compound phase or a solid solution phase consisting of at least one compound, the at least one compound containing tungsten, at least one metallic element other than tungsten selected from elements of groups 4, 5, and 6 of the periodic table, and at least one element selected from carbon, nitrogen, oxygen, and boron.

3. The cemented carbide according to claim 1, wherein the second hard phase is a (W, Ti, Ta)C composite compound.

4. A cutting tool comprising the cemented carbide according to claim 1 as a substrate.

5. The cutting tool according to claim 4, wherein at least part of a surface of the substrate is covered with a hard film.

* * * * *